United States Patent
Chuang et al.

(10) Patent No.: US 12,550,418 B2
(45) Date of Patent: Feb. 10, 2026

(54) ETCH STOP LAYER FOR REMOVAL OF SUBSTRATE IN STACKING TRANSISTORS AND METHODS OF FORMING THE SAME

(71) Applicant: Taiwan Semiconductor Manufacturing Co., Ltd., Hsinchu (TW)

(72) Inventors: Yen Chuang, Hsinchu (TW); Ji-Yin Tsai, Zhudong Township (TW); Jet-Rung Chang, Hsinchu (TW); Zheng Hui Lim, Hsinchu (TW); Ta-Chun Ma, New Taipei (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 307 days.

(21) Appl. No.: 18/365,763

(22) Filed: Aug. 4, 2023

(65) Prior Publication Data

US 2025/0048716 A1 Feb. 6, 2025

(51) Int. Cl.
*H10D 84/03* (2025.01)
*H10D 30/01* (2025.01)
*H10D 64/01* (2025.01)
*H10D 84/01* (2025.01)

(52) U.S. Cl.
CPC ......... *H10D 84/038* (2025.01); *H10D 30/014* (2025.01); *H10D 64/017* (2025.01); *H10D 84/0188* (2025.01)

(58) Field of Classification Search
CPC .............. H10D 30/01; H10D 30/014; H10D 30/019–0198; H10D 30/0273; H10D 30/43; H10D 30/435; H10D 30/501–509; H10D 62/121; H10D 64/017; H10D 84/01; H10D 84/0167; H10D 84/0188; H10D 84/038; H10D 84/83; H10D 84/8311; H10D 84/8312; H10D 84/83125; H10D 84/83135; H10D 84/83138; H10D 84/8314; H10D 84/8316; H10D 84/832–833; H10D 84/835; H10D 84/836; H10D 84/837–839; H10D 84/85; H10D 84/851–852

See application file for complete search history.

(56) References Cited

U.S. PATENT DOCUMENTS

| | | | |
|---|---|---|---|
| 11,616,133 B2 | 3/2023 | Chang et al. | |
| 11,862,709 B2 | 1/2024 | Chang et al. | |
| 11,901,410 B2 | 2/2024 | Chen et al. | |
| 12,068,395 B2 | 8/2024 | Chen et al. | |
| 2024/0429277 A1* | 12/2024 | Bao | H01L 25/074 |

FOREIGN PATENT DOCUMENTS

| | | |
|---|---|---|
| CN | 115588687 A | 1/2023 |
| TW | 202133227 A | 9/2021 |
| TW | 202240702 A | 10/2022 |
| TW | 202243024 A | 11/2022 |

* cited by examiner

*Primary Examiner* — Cheung Lee
(74) *Attorney, Agent, or Firm* — Slater Matsil, LLP

(57) ABSTRACT

Embodiments utilize a silicon germanium layer deposited to a low germanium percentage under a substrate. The substrate is used to form a field effect transistor FET structure. After formation of the FET, the silicon germanium layer is oxidized to drive germanium to a concentrated sublayer of the silicon germanium layer. The sublayer is used as a stop layer to remove the oxidized portion of the silicon germanium layer.

20 Claims, 12 Drawing Sheets

ETCH STOP LAYER FOR REMOVAL OF SUBSTRATE IN STACKING TRANSISTORS AND METHODS OF FORMING THE SAME

BACKGROUND

Semiconductor devices are used in a variety of electronic applications, such as, for example, personal computers, cell phones, digital cameras, and other electronic equipment. Semiconductor devices are typically fabricated by sequentially depositing insulating or dielectric layers, conductive layers, and semiconductor layers over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area. However, as the minimum features sizes are reduced, additional problems arise that should be addressed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
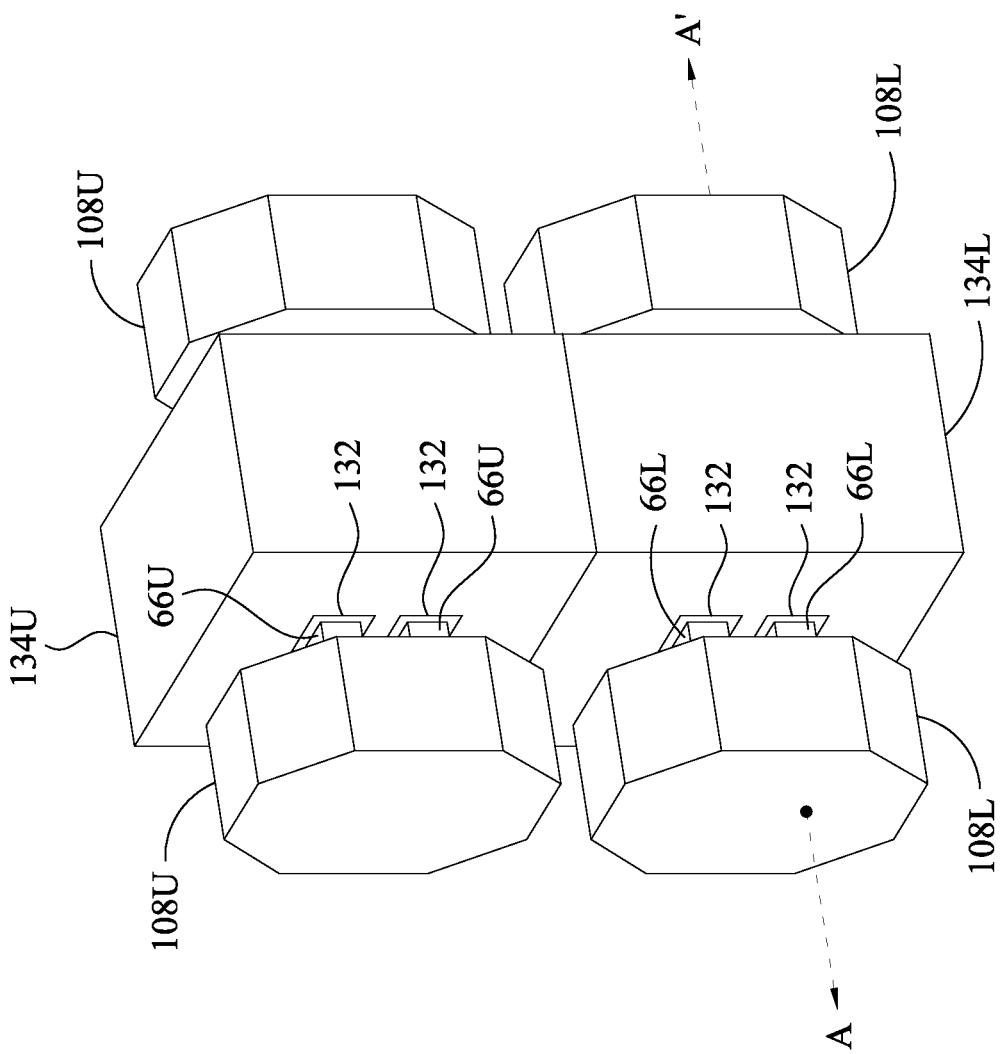
FIG. 1 illustrates an example of a stacking transistor schematic in a three-dimensional view, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

According to various embodiments, stacking transistors (e.g., complementary field effect transistors (CFETs)) are formed. A stacking transistor includes a lower nanostructure-FET and an upper nanostructure-FET. In some embodiments, the nanostructures may be formed over an etch stop layer (ESL) which is used to access the back side of the stacking transistor for forming a power rail and/or signals to the stacking transistor devices. Embodiments enhance the etch selectivity provided by the ESL while mitigating the risk of fracturing or cracking to occur in the ESL. The enhancement of the etch selectivity of the ESL is achieved by increasing the concentration of germanium by a condensing process that drives germanium from part of a silicon germanium layer to increase germanium percentage in another part of the silicon germanium layer. As a result, device performance and manufacturing ease of the completed stacking transistors can be improved.

FIG. 1 illustrates an example of a stacking transistor (e.g., CFET) schematic, in accordance with some embodiments. FIG. 1 is a three-dimensional view, where some features of the stacking transistor are omitted for illustration clarity.

The stacking transistors include multiple vertically stacked nanostructure-FETs (e.g., nanowire FETs, nanosheet FETs, multi bridge channel (MBC) FETs, nanoribbon FETs, gate-all-around (GAA) FETs, or the like). In other embodiments, the stacking transistors may include vertically stacked transistors of a different type than nanostructure-FETs (e.g., finFETs, or the like). For example, a stacking transistor may include a lower nanostructure-FET of a first device type (e.g., n-type/p-type) and an upper nanostructure-FET of a second device type (e.g., p-type/n-type). In embodiments where the stacking transistor is a CFET, the second device type is opposite to the first device type. Specifically, the CFET may include a lower PMOS transistor and an upper NMOS transistor, or the CFET may include a lower NMOS transistor and an upper PMOS transistor. Each of the nanostructure-FETs include semiconductor nanostructures 66 (including lower semiconductor nanostructures 66L and upper semiconductor nanostructures 66U), where the semiconductor nanostructures 66 act as channel regions for the nanostructure-FETs. The semiconductor nanostructures 66 may be nanosheets, nanowires, or the like. The lower semiconductor nanostructures 66L are for a lower nanostructure-FET and the upper semiconductor nanostructures 66U are for an upper nanostructure-FET. A channel isolation material (not explicitly illustrated in FIG. 1, see FIGS. 7 and 12) may be used to separate and electrically isolate the upper semiconductor nanostructures 66U from the lower semiconductor nanostructures 66L.

Gate dielectrics 132 are along top surfaces, sidewalls, and bottom surfaces of the semiconductor nanostructures 66. Gate electrodes 134 (including a lower gate electrode 134L and an upper gate electrode 134U) are over the gate dielectrics 132 and around the semiconductor nanostructures 66. Source/drain regions 108 (including lower epitaxial source/drain regions 108L and upper epitaxial source/drain regions 108U) are disposed at opposing sides of the gate dielectrics 132 and the gate electrodes 134. Source/drain region(s) 108 may refer to a source or a drain, individually or collectively dependent upon the context. Isolation features may be formed to separate desired ones of the source/drain regions 108 and/or desired ones of the gate electrodes 134. For example, a lower gate electrode 134L may optionally be separated from an upper gate electrode 134U by an isolation layer (not explicitly illustrated). Alternatively, a lower gate electrode 134L may be coupled to an upper gate electrode 134U. Further, the upper epitaxial source/drain regions 108U may be separated from lower epitaxial source/drain regions 108L by one or more dielectric layers (not explicitly illustrated in FIG. 1, see FIGS. 7 and 12). The isolation features between channel regions, gates, and source/drain regions allow for vertically stacked transistors, thereby improving device density.

Figure 2:
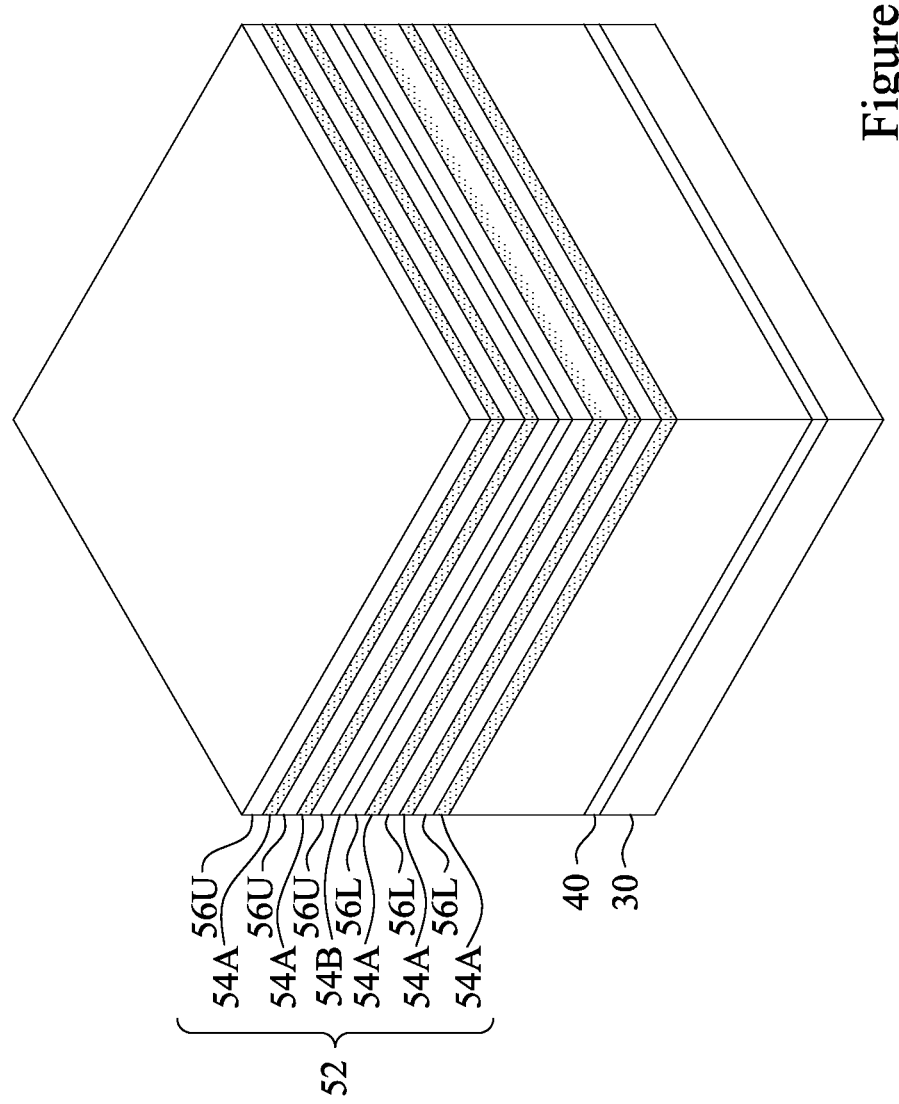
FIGS. 2-12 are views of intermediate stages in the manufacturing of stacking transistors, in accordance with some embodiments.
Figure 3:
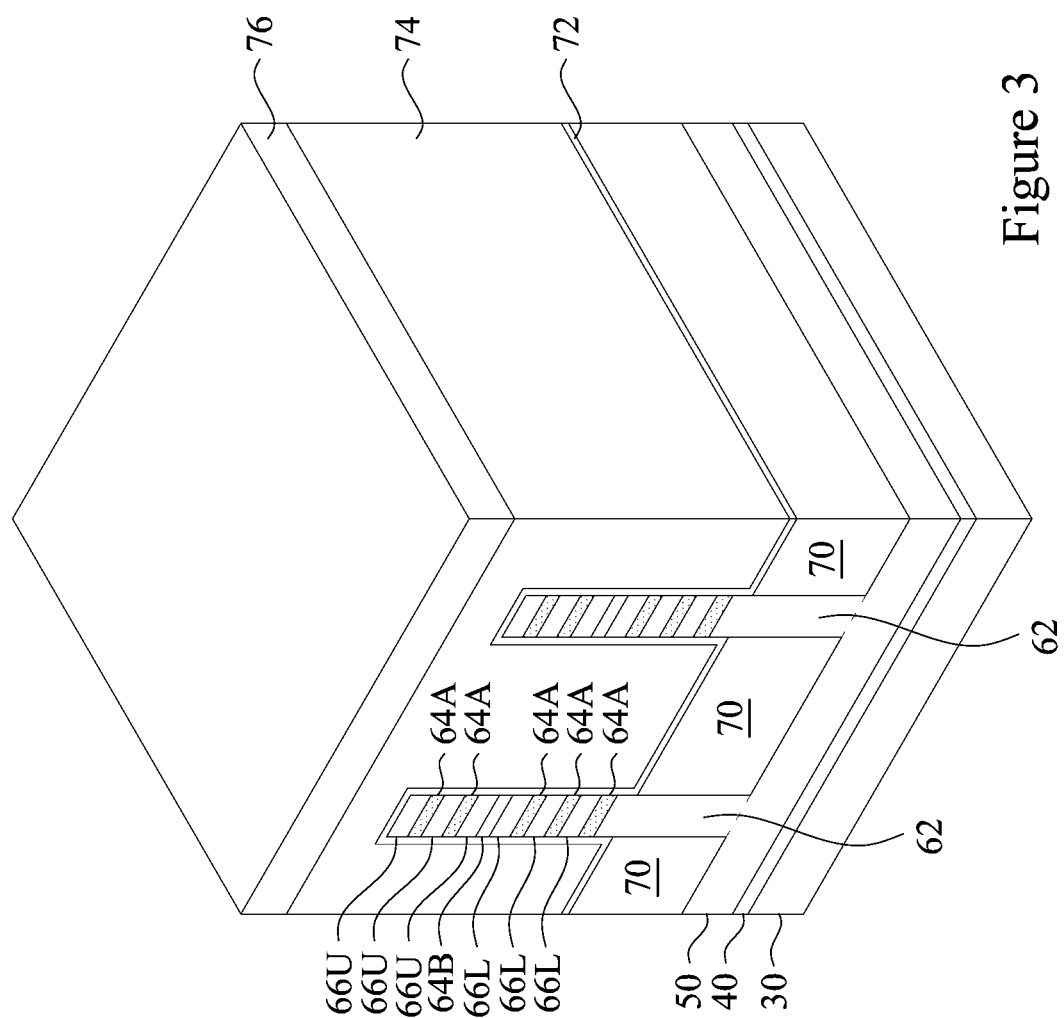

FIG. 1 further illustrates a reference cross-section A-A' that is used in later figures. Specifically, cross-section A-A' is parallel to a longitudinal axis of the semiconductor nanostructures 66 of a stacking transistor and in a direction of, for example, a current flow between the source/drain regions 108 of the stacking transistor. FIGS. 2-12 are views of intermediate stages in the manufacturing of stacking transistors and formation of metallization patterns to contacts of stacking transistors, in accordance with some embodiments. FIGS. 2 and 3 are three-dimensional views showing a similar three-dimensional view as FIG. 1, and FIGS. 4-12 illustrate cross-sectional views along a similar cross-section as reference cross-section A-A' in FIG. 1.

In FIG. 2, a substrate 30 is provided. The substrate 30 may be a semiconductor substrate, such as a bulk semiconductor, a semiconductor-on-insulator (SOI) substrate, or the like. The substrate 30 may be a wafer, such as a silicon wafer. Generally, an SOI substrate is a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the substrate 30 may include silicon; germanium; a compound semiconductor including carbon-doped silicon, gallium arsenide, gallium phosphide, indium phosphide, indium arsenide, and/or indium antimonide; an alloy semiconductor including silicon-germanium, gallium arsenide phosphide, aluminum indium arsenide, aluminum gallium arsenide, gallium indium arsenide, gallium indium phosphide, and/or gallium indium arsenide phosphide; or combinations thereof.

Embodiments utilize a backside power rail and/or signal routing to couple to the stacking transistor which is formed. To assist in accessing the backside of the stacking transistors, the substrate 30 is removable in a later process. An etch stop layer (ESL) 40 is formed over the substrate 30 so that when the substrate 30 is removed, the ESL 40 provides a stop for the process of removing the substrate 30. Thus, it is desirable for the ESL 40 to have good etch selectivity from the substrate 30. Typically, such an etch stop layer is formed to be between about 10 nm and 50 nm and made of silicon germanium where the percentage of germanium is between 20% and 50% to provide good etch selectivity. Such a high germanium percentage, however, can cause fracturing top to bottom in the etch stop layer that develops during subsequent process steps. This fracturing can propagate to the overlying layers which will be formed and can therefore cause device failure. Rather than deposit the silicon germanium at this high germanium percentage, the silicon germanium is deposited to a germanium percentage between about 5% and 20%, in accordance with some embodiments. Then, in a subsequent process, prior to removing the substrate 30, the germanium percentage will be increased to be between about 20% and 50%, as described in greater detail below. Increasing the germanium percentage provides better etch selectivity and allows the substrate 30 to be removed without damaging the device layers.

In some embodiments, the ESL 40 may be grown by a process such as vapor phase epitaxy (VPE) or molecular beam epitaxy (MBE), deposited by a process such as chemical vapor deposition (CVD) or atomic layer deposition (ALD), or the like. In some embodiments, the ESL 40 may be formed of epitaxially grown silicon germanium and may be deposited to a thickness between about 100 nm and 1000 nm, having a germanium percentage concentration between 5% and 20%. A subsequent process will drive the germanium from one side of the ESL 40 into the ESL 40 to form a sublayer of the ESL 40 having a germanium percentage concentration between about 20% and 50% to achieve good etch selectivity between this sublayer of the ESL 40 and the substrate 30.

After depositing the ESL 40, a substrate 50 may be formed over the ESL 40. The substrate 50 may be formed of any of the same candidate materials as the substrate 30, which may be doped (e.g., with a p-type or an n-type dopant) or undoped. The material of the substrate 30 and the substrate 50 may be the same material or may be different materials. The substrate 50 may be grown by a process such as vapor phase epitaxy (VPE) or molecular beam epitaxy (MBE), or deposited by a process such as chemical vapor deposition (CVD) or atomic layer deposition (ALD), or the like.

A multi-layer stack 52 is formed over the substrate 50. The multi-layer stack 52 includes alternating dummy layers 54 (including first dummy layers 54A and a second dummy layer 54B) and semiconductor layers 56 (including lower semiconductor layers 56L and upper semiconductor layers 56U). The lower semiconductor layers 56L and a subset of the first dummy layers 54A are disposed below the second dummy layer 54B. The upper semiconductor layers 56U and another subset of the first dummy layers 54A are disposed above the second dummy layer 54B. As subsequently described in greater detail, the dummy layers 54 will be removed and the semiconductor layers 56 will be patterned to form channel regions of stacking transistors. Specifically, the lower semiconductor layers 56L will be patterned to form channel regions of the lower nanostructure-FETs of the stacking transistors, and the upper semiconductor layers 56U will be patterned to form channel regions of the upper nanostructure-FETs of the stacking transistors.

The multi-layer stack 52 is illustrated as including six of the dummy layers 54 and six of the semiconductor layers 56. It should be appreciated that the multi-layer stack 52 may include any number of the dummy layers 54 and the semiconductor layers 56. Each layer of the multi-layer stack 52 may be grown by a process such as vapor phase epitaxy (VPE) or molecular beam epitaxy (MBE), deposited by a process such as chemical vapor deposition (CVD) or atomic layer deposition (ALD), or the like.

The first dummy layers 54A are formed of a first semiconductor material, and the second dummy layer 54B is formed of a second semiconductor material. The first and second semiconductor materials may be selected from the candidate semiconductor materials of the substrate 50. The semiconductor materials of the first dummy layers 54A and the second dummy layer 54B will be subsequently described in greater detail. The first and second semiconductor materials have a high etching selectivity to one another. As such, the material of the second dummy layer 54B may be removed at a faster rate than the material of the first dummy layers 54A in subsequent processing.

The semiconductor layers 56 (including the lower semiconductor layers 56L and upper semiconductor layers 56U) are formed of one or more semiconductor material(s). The semiconductor material(s) may be selected from the candidate semiconductor materials of the substrate 50. The lower semiconductor layers 56L and the upper semiconductor layers 56U may be formed of the same semiconductor material, or may be formed of different semiconductor materials. In some embodiments, the lower semiconductor layers 56L and the upper semiconductor layers 56U are both be formed of a semiconductor material suitable for p-type devices and n-type devices, such as silicon. In some embodiments, the lower semiconductor layers 56L are formed of a semiconductor material suitable for p-type devices, such as germanium or silicon-germanium, and the upper semiconductor layers 56U are formed of a semiconductor material suitable for n-type devices, such as silicon or carbon-doped silicon. The semiconductor material(s) of the semiconductor layers 56 will be subsequently described in greater detail. The semiconductor material(s) of the semiconductor layers 56 have a high etching selectivity to the semiconductor materials of the dummy layers 54. As such, the materials of the dummy layers 54 may be removed at a faster rate than the material of the semiconductor layers 56 in subsequent processing.

Some layers of the multi-layer stack 52 may be thicker than other layers of the multi-layer stack 52. The thickness of the second dummy layer 54B may be different (e.g., greater or less) than the thickness of each of the first dummy layers 54A. Specifically, the second dummy layer 54B may have a larger thickness than each of the first dummy layers 54A. Forming the second dummy layer 54B to a large thickness may allow the second dummy layer 54B to be more easily removed in subsequently processing. Additionally, the thickness of each of the semiconductor layers 56 may be different (e.g., greater or less) than the thickness(es) of each of the first dummy layers 54A and/or the second dummy layer 54B. Specifically, each of the semiconductor layers 56 may be thicker than each of the dummy layers 54.

In some embodiments, the first dummy layers 54A are formed of silicon-germanium (Ge percent between 20% and 40%), the second dummy layer 54B is formed of high germanium concentration silicon-germanium (Ge percent between 30% and 60%), and the semiconductor layers 56 are formed of silicon. Utilizing high germanium concentration_silicon-germanium for the second dummy layer 54B allows it to have a high etching selectivity to the first dummy layers 54A and the semiconductor layers 56. For example, the second dummy layer 54B may be at least partially replaced with an isolation structure. As part of the replacement process, the second dummy layer 54B may be removed with an etchant that is selective to the germanium enriched second dummy layer 54B. Accordingly, the second dummy layer 54B may be removed at a faster rate than the first dummy layers 54A and the semiconductor layers 56.

In FIG. 3, fins 62 are formed in the substrate 50 and nanostructures 64, 66 (including first dummy nanostructures 64A, second dummy nanostructures 64B, lower semiconductor nanostructures 66L, middle semiconductor nanostructures 66M, and upper semiconductor nanostructures 66U) are formed in the multi-layer stack 52. In some embodiments, the nanostructures 64, 66 and the fins 62 may be formed in the multi-layer stack 52 and the substrate 50, respectively, by etching trenches in the multi-layer stack 52 and the substrate 50. The etching may be any acceptable etch process, such as a reactive ion etch (RIE), neutral beam etch (NBE), the like, or a combination thereof. The etching may be anisotropic. Forming the nanostructures 64, 66 by etching the multi-layer stack 52 may define the first dummy nanostructures 64A from the first dummy layers 54A, the second dummy nanostructures 64B from the second dummy layer 54B, the lower semiconductor nanostructures 66L from some of the lower semiconductor layers 56L, and the upper semiconductor nanostructures 66U from some of the upper semiconductor layers 56U. The first dummy nanostructures 64A and the second dummy nanostructures 64B may further be collectively referred to as the dummy nanostructures 64. The lower semiconductor nanostructures 66L and the upper semiconductor nanostructures 66U may further be collectively referred to as the semiconductor nanostructures 66.

As subsequently described in greater detail, various one of the nanostructures 64, 66 will be removed to form channel regions of stacking transistors. Specifically, the lower semiconductor nanostructures 66L will act as channel regions for lower nanostructure-FETs of the stacking transistors. Additionally, the upper semiconductor nanostructures 66U will act as channel regions for upper nanostructure-FETs of the stacking transistors.

The fins 62 and the nanostructures 64, 66 may be patterned by any suitable method. For example, the fins 62 and the nanostructures 64, 66 may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins 62 and the nanostructures 64, 66. In some embodiments, a mask (or other layer) may remain on the nanostructures 64, 66.

Although each of the fins 62 and the nanostructures 64, 66 are illustrated as having a constant width throughout, in other embodiments, the fins 62 and/or the nanostructures 64, 66 may have tapered sidewalls such that a width of each of the fins 62 and/or the nanostructures 64, 66 continuously increases in a direction towards the substrate 50. In such embodiments, each of the nanostructures 64, 66 may have a different width and be trapezoidal in shape.

As also illustrated in FIG. 3, isolation regions 70 are formed adjacent the fins 62. The isolation regions 70 may be formed by depositing an insulating material over the substrate 50, the fins 62, and nanostructures 64, 66, and between adjacent fins 62. The insulating material may be an oxide, such as silicon oxide, a nitride, the like, or a combination thereof, and may be formed by high-density plasma chemical vapor deposition (HDP-CVD), flowable chemical vapor deposition (FCVD), the like, or a combination thereof. Other insulating materials formed by any acceptable process may be used. In some embodiments, the insulating material is silicon oxide formed by an FCVD process. An anneal process may be performed once the insulating material is formed. In an embodiment, the insulating material is formed such that excess insulating material covers the nanostructures 64, 66. Although the insulating material is illustrated as a single layer, some embodiments may utilize multiple layers. For example, in some embodiments a liner (not separately illustrated) may first be formed along a surface of the substrate 50, the fins 62, and the nanostructures 64, 66.

Thereafter, a fill material, such as one of the previously described insulating materials may be formed over the liner.

A removal process is then applied to the insulating material to remove excess insulating material over the nanostructures 64, 66. In some embodiments, a planarization process such as a chemical mechanical polish (CMP), an etch-back process, combinations thereof, or the like may be utilized. The planarization process exposes the nanostructures 64, 66 such that top surfaces of the nanostructures 64, 66 and the insulating material are level after the planarization process is complete.

The insulating material is then recessed to form the isolation regions 70. The insulating material is recessed such that upper portions of the fins 62 protrude from between neighboring isolation regions 70. Further, the top surfaces of the isolation regions 70 may have a flat surface as illustrated, a convex surface, a concave surface (such as dishing), or a combination thereof. The top surfaces of the isolation regions 70 may be formed flat, convex, and/or concave by an appropriate etch. The isolation regions 70 may be recessed using an etching process, such as one that is selective to the insulating material (e.g., selectively etches the insulating material at a faster rate than the materials of the fins 62 and the nanostructures 64, 66). For example, an oxide removal using, for example, dilute hydrofluoric (dHF) acid may be used.

Additionally in FIG. 3, a dummy dielectric layer 72 is formed on the fins 62 and/or the nanostructures 64, 66. The dummy dielectric layer 72 may be, for example, silicon oxide, silicon nitride, a combination thereof, or the like, and may be deposited or thermally grown according to acceptable techniques. A dummy gate layer 74 is formed over the dummy dielectric layer 72, and a mask layer 76 is formed over the dummy gate layer 74. The dummy gate layer 74 may be deposited over the dummy dielectric layer 72 and then planarized, such as by a CMP. The mask layer 76 may be deposited over the dummy gate layer 74. The dummy gate layer 74 may be a conductive or non-conductive material and may be selected from a group including amorphous silicon, polycrystalline-silicon (polysilicon), poly-crystalline silicon-germanium (poly-SiGe), metallic nitrides, metallic silicides, metallic oxides, and metals. The dummy gate layer 74 may be deposited by physical vapor deposition (PVD), CVD, sputter deposition, or other techniques for depositing the selected material. The dummy gate layer 74 may be formed of other materials that have a high etching selectivity to insulating materials. The mask layer 76 may include, for example, silicon nitride, silicon oxynitride, or the like. In the illustrated embodiment, the dummy dielectric layer 72 covers the isolation regions 70, such that the dummy dielectric layer 72 extends between the dummy gate layer 74 and the isolation regions 70. In another embodiment, the dummy dielectric layer 72 covers only the fins 62 and/or the nanostructures 64, 66.

Figure 4:
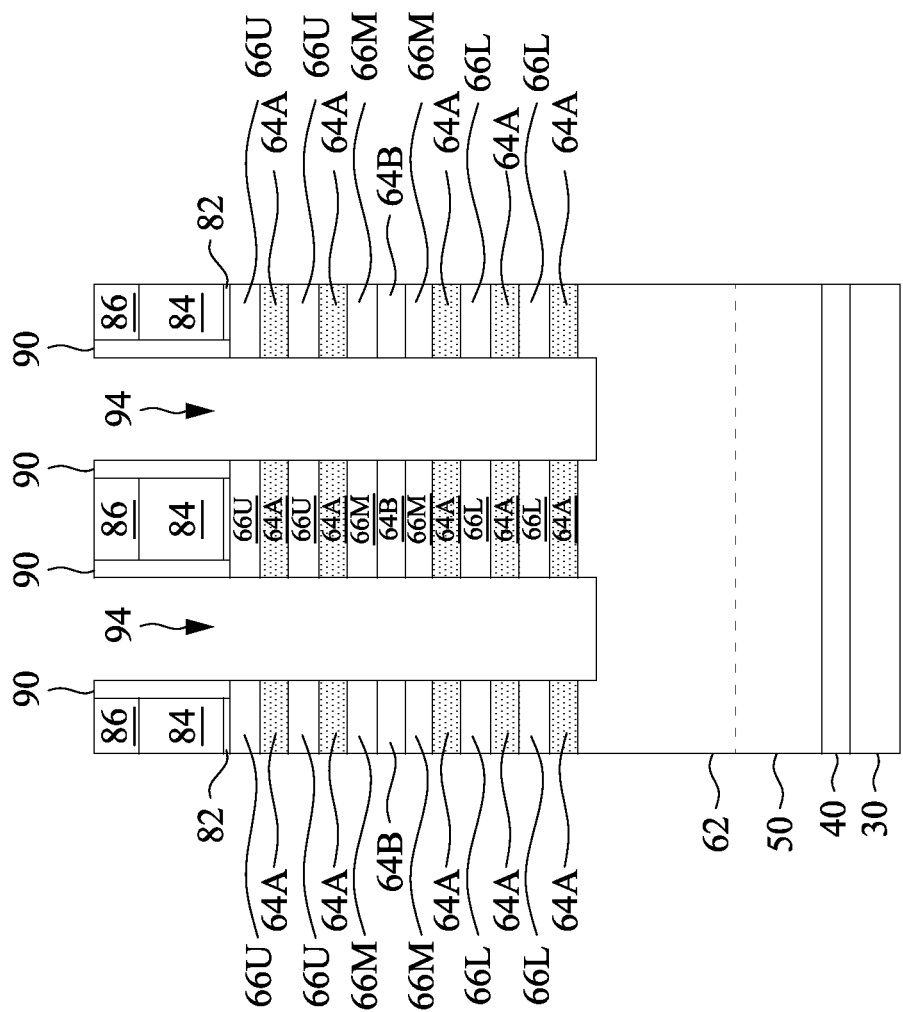

In FIG. 4, the mask layer 76 may be patterned using acceptable photolithography and etching techniques to form masks 86. The pattern of the masks 86 then may be transferred to the dummy gate layer 74 and to the dummy dielectric layer 72 to form dummy gates 84 and dummy dielectrics 82, respectively. The dummy gates 84 cover respective channel regions of the nanostructures 64, 66. The pattern of the masks 86 may be used to physically separate each of the dummy gates 84 from adjacent dummy gates 84. The dummy gates 84 may also have a lengthwise direction substantially perpendicular to the lengthwise direction of respective semiconductor fins 62. The masks 86 can optionally be removed after patterning, such as by any acceptable etching technique.

Further in FIG. 4, gate spacers 90 and source/drain recesses 94 are formed. The gate spacers 90 are formed over the nanostructures 64, 66 and on exposed sidewalls of the masks 86 (if present), the dummy gates 84, and the dummy dielectrics 82. The gate spacers 90 may be formed by conformally forming one or more dielectric material(s) and subsequently etching the dielectric material(s). Acceptable dielectric materials may include silicon oxide, silicon nitride, silicon oxynitride, silicon oxycarbonitride, or the like, which may be formed by a deposition process such as chemical vapor deposition (CVD), atomic layer deposition (ALD), or the like. Other dielectric materials formed by any acceptable process may be used. Any acceptable etch process, such as a dry etch, a wet etch, the like, or a combination thereof, may be performed to pattern the dielectric material(s). The etching may be anisotropic. The dielectric material(s), when etched, have portions left on the sidewalls of the dummy gates 84 (thus forming the gate spacers 90). In some embodiments, the dielectric material(s), when etched, may also have portions left on the sidewalls of the semiconductor fins 62 and/or the nanostructures 64, 66. It is noted that the previous disclosure generally describes a process of forming spacers. Other processes and sequences may be used. For example, fewer or additional spacers may be utilized, different sequence of steps may be utilized, additional spacers may be formed and removed, and/or the like.

Source/drain recesses 94 are formed in the semiconductor fins 62 and the nanostructures 64, 66. Epitaxial source/drain regions will be subsequently formed in the source/drain recesses 94. The source/drain recesses 94 may extend through the nanostructures 64, 66 into the semiconductor fins 62. The semiconductor fins 62 may be etched such that bottom surfaces of the source/drain recesses 94 are disposed above, below, or level with the top surfaces of the isolation regions 70. The source/drain recesses 94 may be formed by etching the semiconductor fins 62 and the nanostructures 64, 66 using anisotropic etching processes, such as RIE, NBE, or the like. The gate spacers 90 and the dummy gates 84 mask portions of the semiconductor fins 62, the nanostructures 64, 66, and the isolation material 100 during the etching processes used to form the source/drain recesses 94. A single etch process or multiple etch processes may be used to etch each layer of the nanostructures 64, 66, the isolation material 100, and/or the semiconductor fins 62. Timed etch processes may be used to stop the etching of the source/drain recesses 94 after the source/drain recesses 94 reach a desired depth.

Figure 5:
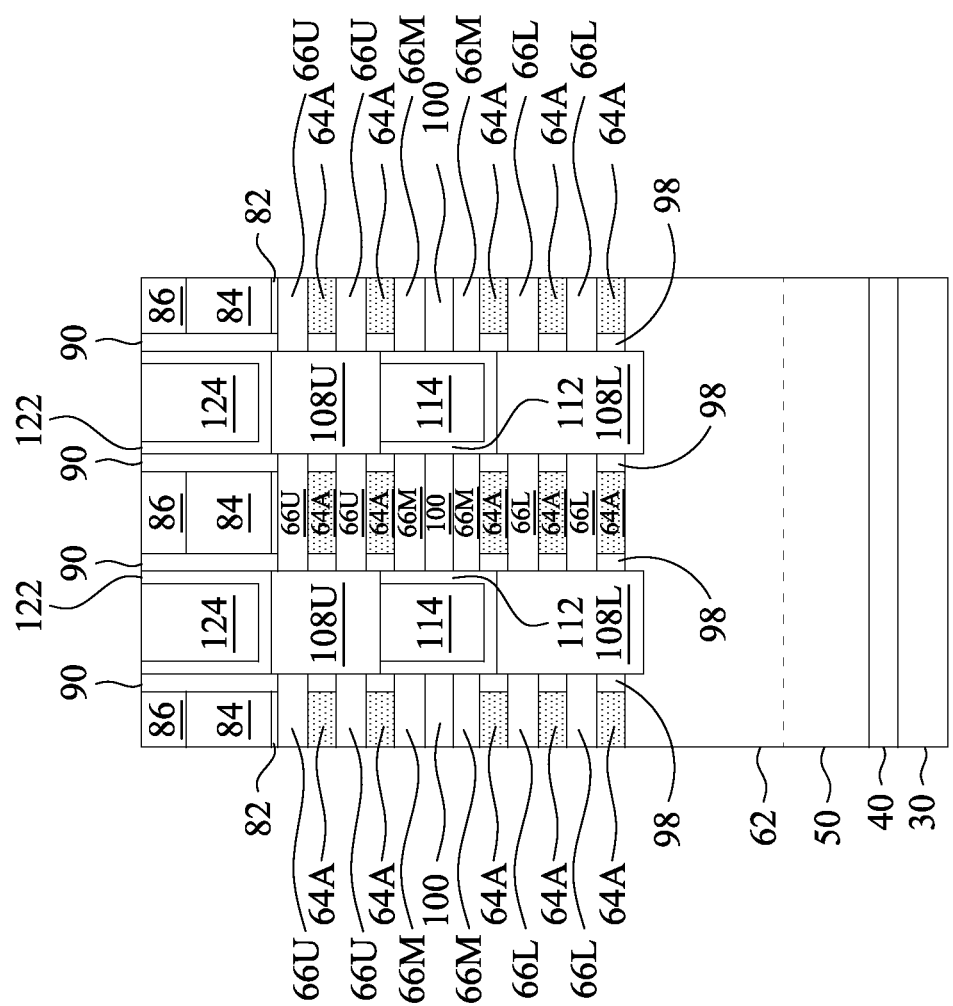

In FIG. 5, inner spacers 98 and isolation material 100 are formed. Forming inner spacers 98 and isolation material 100 may include an etching process that laterally etches the dummy nanostructures 64A and removes the dummy nanostructure 64B. The etching process may be isotropic and may be selective to the material of the dummy nanostructures 64, so that the dummy nanostructures 64 are etched at a faster rate than the semiconductor nanostructures 66. The etching process may also be selective to the material of the dummy nanostructures 64B, so that the dummy nanostructures 64B are etched at a faster rate than the dummy nanostructures 64A. In this manner, the dummy nanostructures 64B may be completely removed from between the lower semiconductor nanostructures 66L (collectively) and the upper semiconductor nanostructures 66U (collectively) without completely removing the dummy nanostructures 64A. In some embodiments where the dummy nanostructures 64B are formed of germanium or silicon germanium with a high germanium atomic percentage, the dummy nanostructures 64A are formed of silicon germanium with a low germanium atomic percentage, and the semiconductor nanostructures 66 are formed of silicon free from germanium, the etch process may comprise a dry etch process using chlorine gas, with or without a plasma. Because the dummy gates 84 warp around sidewalls of the semiconductor nanostructures 66 (see FIG. 3), the dummy gates 84 may support the upper semiconductor nanostructures 66U so that the upper semiconductor nanostructures 66U do not collapse upon removal of the dummy nanostructures 64B. Further, although sidewalls of the dummy nanostructures 64A are illustrated as being straight after the etching, the sidewalls may be concave or convex.

Inner spacers 98 are formed on sidewalls of the recessed dummy nanostructures 64A, and isolation material 100 are formed between the upper semiconductor nanostructures 66U (collectively) and the lower semiconductor nanostructures 66L (collectively). As subsequently described in greater detail, source/drain regions will be subsequently formed in the source/drain recesses 94, and the dummy nanostructures 64A will be replaced with corresponding gate structures. The inner spacers 98 act as isolation features between the subsequently formed source/drain regions and the subsequently formed gate structures. Further, the inner spacers 98 may be used to prevent damage to the subsequently formed source/drain regions by subsequent etch processes, such as the etch processes used to form gate structures. Isolation material 100, on the other hand, are used to isolate the upper semiconductor nanostructures 66U (collectively) from the lower semiconductor nanostructures 66L (collectively). Further, middle semiconductor nanostructures (ones of the semiconductor nanostructures 66 in contact with the isolation material 100) and the isolation material 100 may define the boundaries of the lower nanostructure-FETs and the upper nanostructure-FETs.

The inner spacers 98 and the isolation material 100 may be formed by conformally depositing an insulating material in the source/drain recesses 94, on sidewalls of the dummy nanostructures 64, and between the upper and lower semiconductor nanostructures 66U and 66L, and then etching the insulating material. The insulating material may be a hard dielectric material, such as a carbon-containing dielectric material, such as silicon oxycarbonitride, silicon oxycarbide, silicon oxynitride, or the like. Other low-dielectric constant (low-k) materials having a k-value less than about 3.5 may be utilized. The insulating material may be formed by a deposition process, such as ALD, CVD, or the like. The etching of the insulating material may be anisotropic or isotropic. The insulating material, when etched, has portions remaining in the sidewalls of the dummy nanostructures 66A (thus forming the inner spacers 98) and has portions remaining in between the upper and lower semiconductor nanostructures 66U and 66L (thus forming the isolation material 100).

As also illustrated by FIG. 5, lower and upper epitaxial source/drain regions 108L and 108U are formed. The lower epitaxial source/drain regions 108L are formed in the lower portions of the source/drain recesses 94. The lower epitaxial source/drain regions 108L are in contact with the lower semiconductor nanostructures 66L and are not in contact with the upper semiconductor nanostructures 66U. Inner spacers 98 electrically insulate the lower epitaxial source/drain regions 108L from the dummy nanostructures 64A, which will be replaced with replacement gates in subsequent processes.

The lower epitaxial source/drain regions 108L are epitaxially grown, and have a conductivity type that is suitable for the device type (p-type or n-type) of the lower nanostructure-FETs. When lower epitaxial source/drain regions 108L are n-type source/drain regions, the respective material may include silicon or carbon-doped silicon, which is doped with an n-type dopant such as phosphorous, arsenic, or the like. When lower epitaxial source/drain regions 108L are p-type source/drain regions, the respective material may include silicon or silicon germanium, which is doped with a p-type dopant such as boron, indium, or the like. The lower epitaxial source/drain regions 108L may be in-situ doped, and may be, or may not be, implanted with the corresponding p-type or n-type dopants. During the epitaxy of the lower epitaxial source/drain regions 108L, the upper semiconductor nanostructures 66U may be masked to prevent undesired epitaxial growth on the upper semiconductor nanostructures 66U. After the lower epitaxial source/drain regions 108L are grown, the masks on the upper semiconductor nanostructures 66U may then be removed.

As a result of the epitaxy processes used for forming the lower epitaxial source/drain regions 108L, upper surfaces of the lower epitaxial source/drain regions 108L have facets which expand laterally outward beyond sidewalls of semiconductor fins 62. In some embodiments, adjacent lower epitaxial source/drain regions 108L remain separated after the epitaxy process is completed. In other embodiments, these facets cause neighboring lower epitaxial source/drain regions 108L of a same FET to merge.

A first contact etch stop layer (CESL) 112 and a first ILD 114 are formed over the lower epitaxial source/drain regions 108L. The first CESL 112 may be formed of a dielectric material having a high etching selectivity from the etching of the first ILD 114, such as silicon nitride, silicon oxide, silicon oxynitride, or the like, which may be formed by any suitable deposition process, such as CVD, ALD, or the like. The first ILD 114 may be formed of a dielectric material, which may be deposited by any suitable method, such as CVD, plasma-enhanced CVD (PECVD), or FCVD. The applicable dielectric material of the first ILD 114 may include phospho-silicate glass (PSG), boro-silicate glass (BSG), boron-doped phospho-silicate glass (BPSG), undoped silicate glass (USG), silicon oxide, or the like.

The formation processes may include depositing a conformal CESL layer, depositing a material for the first ILD 114, followed by a planarization process and then an etch-back process. In some embodiments, the first ILD 114 is etched first, leaving the first CESL 112 unetched. An anisotropic etching process is then performed to remove the portions of the first CESL 112 higher than the recessed first ILD 114. After the recessing, the sidewalls of the upper semiconductor nanostructures 66U are exposed.

Upper epitaxial source/drain regions 108U are then formed in the upper portions of the source/drain recesses 94. The upper epitaxial source/drain regions 108U may be epitaxially grown from exposed surfaces of the upper semiconductor nanostructures 66U. The materials of upper epitaxial source/drain regions 108U may be selected from the same candidate group of materials for forming lower epitaxial source/drain regions 108L, depending on the desired conductivity type of upper epitaxial source/drain regions 108U. The conductivity type of the upper epitaxial source/drain regions 108U may be opposite the conductivity type of the lower epitaxial source/drain regions 108L in embodiments when the stacking transistors are CFETs. For example, the upper epitaxial source/drain regions 108U may be oppositely doped from the lower epitaxial source/drain regions 108L. Alternatively, the conductivity types of the upper epitaxial source/drain regions 108U and the lower epitaxial source/drain regions 108L may be the same. The upper epitaxial source/drain regions 108U may be in-situ doped, and/or may be implanted, with an n-type or p-type dopant. Adjacent upper epitaxial source/drain regions 108U may remain separated after the epitaxy process or may be merged.

After the upper epitaxial source/drain regions 108U are formed, a second CESL 122 and a second ILD 124 are formed. The materials and the formation methods may be similar to the materials and the formation methods of first CESL 112 and first ILD 114, respectively, and are not discussed in detail herein. The formation process may include depositing the layers for the second CESL 122 and the second ILD 124, and performing a planarization process to remove the excess portion of the corresponding layers. After the planarization process, top surfaces of the second ILD 124, the gate spacers 90, and the masks 86 (if present) or the dummy gates 84 are substantially coplanar (within process variations). Accordingly, the top surfaces of the masks 86 (if present) or the dummy gates 84 are exposed through the second ILD 124. In the illustrated embodiment, the masks 86 remain after the removal process. In other embodiments, the masks 86 are removed such that the top surfaces of the dummy gates 84 are exposed through the second ILD 124.

Figure 6:
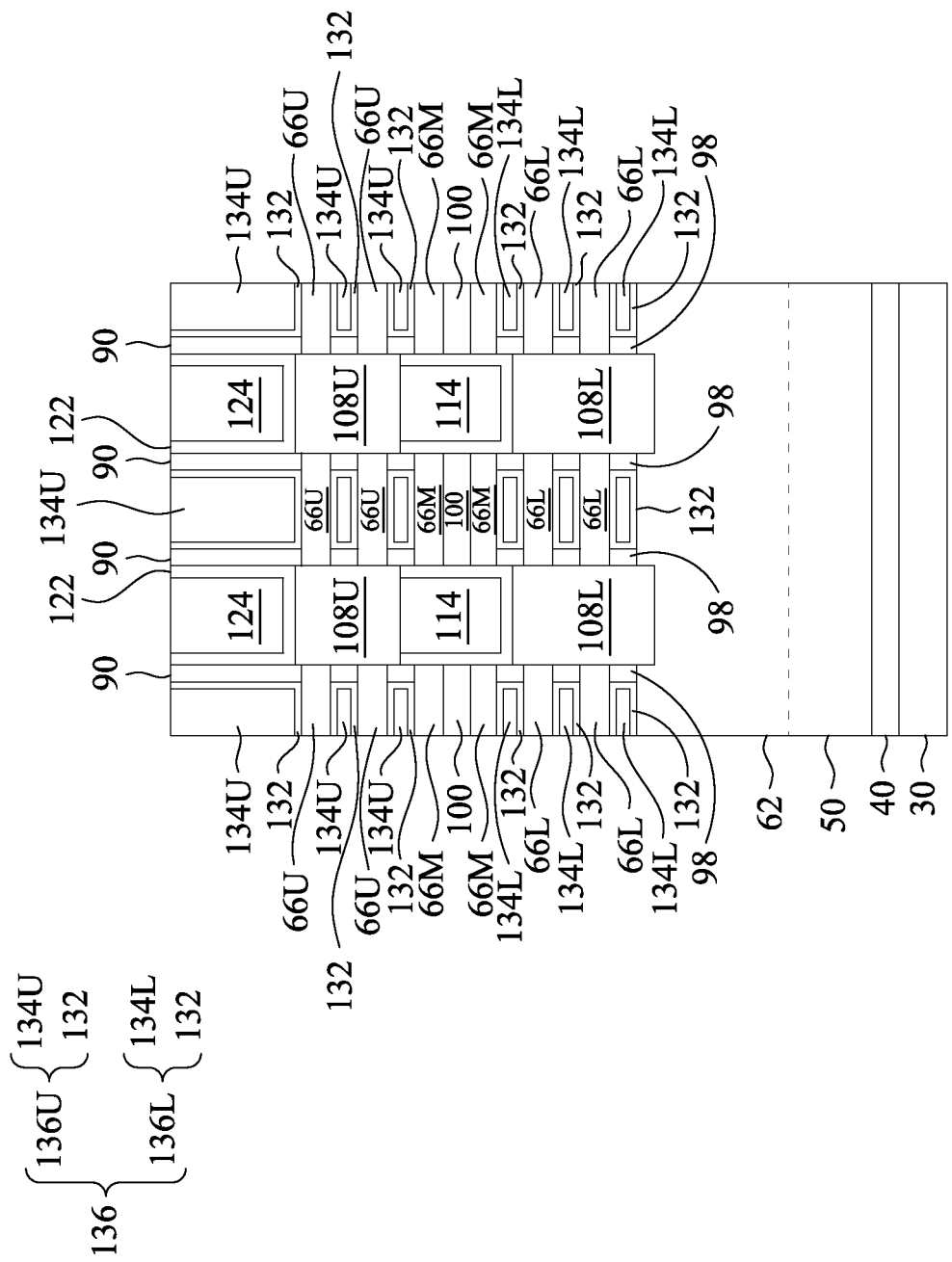

FIG. 6 illustrates a replacement gate process to replace the dummy gate stacks 82/84 and the dummy nanostructures 64A with gate stacks 136. The replacement gate process includes first removing the dummy gate stacks 82/84 and the remaining portions of the dummy nanostructures 64A. The hard mask 86 (if present) may also be removed. The dummy gate stacks 82/84 are removed in one or more etching processes, so that recesses are defined between the gate spacers 90 and the semiconductor nanostructures 66/dummy nanostructures 64A are exposed. The remaining portions of the dummy nanostructures 64A are then removed through etching, so that the recesses extend between the semiconductor nanostructures 66. In the etching process, the dummy nanostructures 64A is etched at a faster rate than the semiconductor nanostructures 66, the isolation material 100, and the inner spacers 98. The etching may be isotropic. For example, when the dummy nanostructures 64A are formed of silicon-germanium, and the semiconductor nanostructures 66 are formed of silicon, the etch process may include a wet etch process using tetramethylammonium hydroxide (TMAH), ammonium hydroxide ($NH_4OH$), or the like.

Then, gate dielectrics 132 are deposited in the recesses between the gate spacers 90 and on the exposed semiconductor nanostructures 66. The gate dielectrics 132 are conformally formed on the exposed surfaces of the recesses (the removed gate stacks 82/84 and the dummy nanostructures 64) including the semiconductor nanostructures 66, the isolation material 100, and the gate spacers 90. In some embodiments, the gate dielectrics 78 wrap around all (e.g., four) sides of the semiconductor nanostructures 66 and the isolation material 100. Specifically, the gate dielectrics 132 may be formed on the top surfaces of the fins 62; on the top surfaces, the sidewalls, and the bottom surfaces of the semiconductor nanostructures 66U, 66L; on the sidewalls of the isolation material 100; and on the sidewalls of the gate spacers 90. The gate dielectrics 132 may include an oxide such as silicon oxide or a metal oxide, a silicate such as a metal silicate, combinations thereof, multi-layers thereof, or the like. The gate dielectrics 132 may include a high-dielectric constant (high-k) material having a k-value greater than about 7.0, such as a metal oxide or a silicate of hafnium, aluminum, zirconium, lanthanum, manganese, barium, titanium, lead, and combinations thereof. The formation methods of the gate dielectrics 132 may include molecular-beam deposition (MBD), ALD, PECVD, and the like. Although single-layered gate dielectrics 132 are illustrated, the gate dielectrics 132 may include multiple layers, such as an interfacial layer and an overlying high-k dielectric layer.

Lower gate electrodes 134L are formed on the gate dielectrics 132 around the lower semiconductor nanostructures 66L (see FIG. 1). For example, the lower gate electrodes 134L wrap around the lower semiconductor nanostructures 66L. The lower gate electrodes 134L may be formed of a metal-containing material such as tungsten, titanium, titanium nitride, tantalum, tantalum nitride, tantalum carbide, aluminum, ruthenium, cobalt, combinations thereof, multi-layers thereof, or the like. Although single-layered gate electrodes are illustrated, the lower gate electrodes 134L may include any number of work function tuning layers, any number of barrier layers, any number of glue layers, and a fill material.

The lower gate electrodes 134L are formed of material(s) that are suitable for the device type of the lower nanostructure-FETs. For example, the lower gate electrodes 134L may include one or more work function tuning layer(s) formed of material(s) that are suitable for the device type of the lower nanostructure-FETs. In some embodiments, the lower gate electrodes 134L include an n-type work function tuning layer, which may be formed of titanium aluminum, titanium aluminum carbide, tantalum aluminum, tantalum carbide, combinations thereof, or the like. In some embodiments, the lower gate electrodes 134L include a p-type work function tuning layer, which may be formed of titanium nitride, tantalum nitride, combinations thereof, or the like. Additionally or alternatively, the lower gate electrodes 134L may include a dipole-inducing element that is suitable for the device type of the lower nanostructure-FETs. Acceptable dipole-inducing elements include lanthanum, aluminum, scandium, ruthenium, zirconium, erbium, magnesium, strontium, and combinations thereof.

The lower gate electrodes 134L may be formed by conformally depositing one or more gate electrode layer(s) and subsequently recessing the gate electrode layer(s). Any acceptable etch process, such as a dry etch, a wet etch, the like, or a combination thereof, may be performed to recess the gate electrode layer(s) to a desired level (e.g., at or below a level of the isolation material 100). The etching may be isotropic. Etching the lower gate electrodes 134L may expose the upper semiconductor nanostructures 66U.

In some embodiments, isolation layers (not explicitly illustrated) may be optionally formed on the lower gate electrodes 134L. The isolation layers act as isolation features between the lower gate electrodes 134L and subsequently formed upper gate electrodes 134U. The isolation layers may be formed by conformally depositing a dielectric material (e.g., silicon oxide, silicon nitride, silicon oxynitride, silicon oxycarbonitride, combinations thereof, or the like) and subsequently recessing the dielectric material to expose the upper semiconductor nanostructures 66U.

Then, upper gate electrodes 134U are formed on the isolation layers described above (if present) or directly on the lower gate electrodes 134L. The upper gate electrodes 134U are disposed between the upper semiconductor nanostructures 66U. In some embodiments, the upper gate electrodes 134U wrap around the upper semiconductor nanostructures 66U (see FIG. 1). The upper gate electrodes 134U may be formed of the same candidate materials and candidate processes for forming the lower gate electrodes 134L. The upper gate electrodes 134U are formed of material(s) that are suitable for the device type of the upper nanostructure-FETs. For example, the upper gate electrodes 134U may include one or more n-type and/or p-type work function tuning layer(s) formed of material(s) that are suitable for the device type of the upper nanostructure-FETs. Although single-layered gate electrodes 134U are illustrated, the upper gate electrodes 134U may include any number of work function tuning layers, any number of barrier layers, any number of glue layers, and a fill material.

Additionally, one or more removal processes are performed level top surfaces of the upper gate electrodes 134U and the gate dielectrics 132 with the second ILD 124. The removal process for forming the gate dielectrics 132 may be the same removal process as the removal process for forming the upper gate electrodes 134U. In some embodiments, a planarization process such as a chemical mechanical polish (CMP), an etch-back process, combinations thereof, or the like may be utilized. After the planarization process, the top surfaces of the upper gate electrodes 134U, the gate dielectrics 132, the second ILD 124, and the gate spacers 90 are substantially coplanar (within process variations). Each respective pair of a gate dielectric 132 and a gate electrode 134 (including an upper gate electrode 134U and/or a lower gate electrode 134L) may be collectively referred to as a "gate stack" 136 (including upper gate stacks 136U and lower gate stacks 136L). Each gate stack 136 extends along three sides (e.g., a top surface, a sidewall, and a bottom surface) of a channel region of a semiconductor nanostructure 66 (see FIG. 1). The lower gate stacks 136L may also extend along sidewalls and/or a top surface of a semiconductor fin 62.

Figure 7:
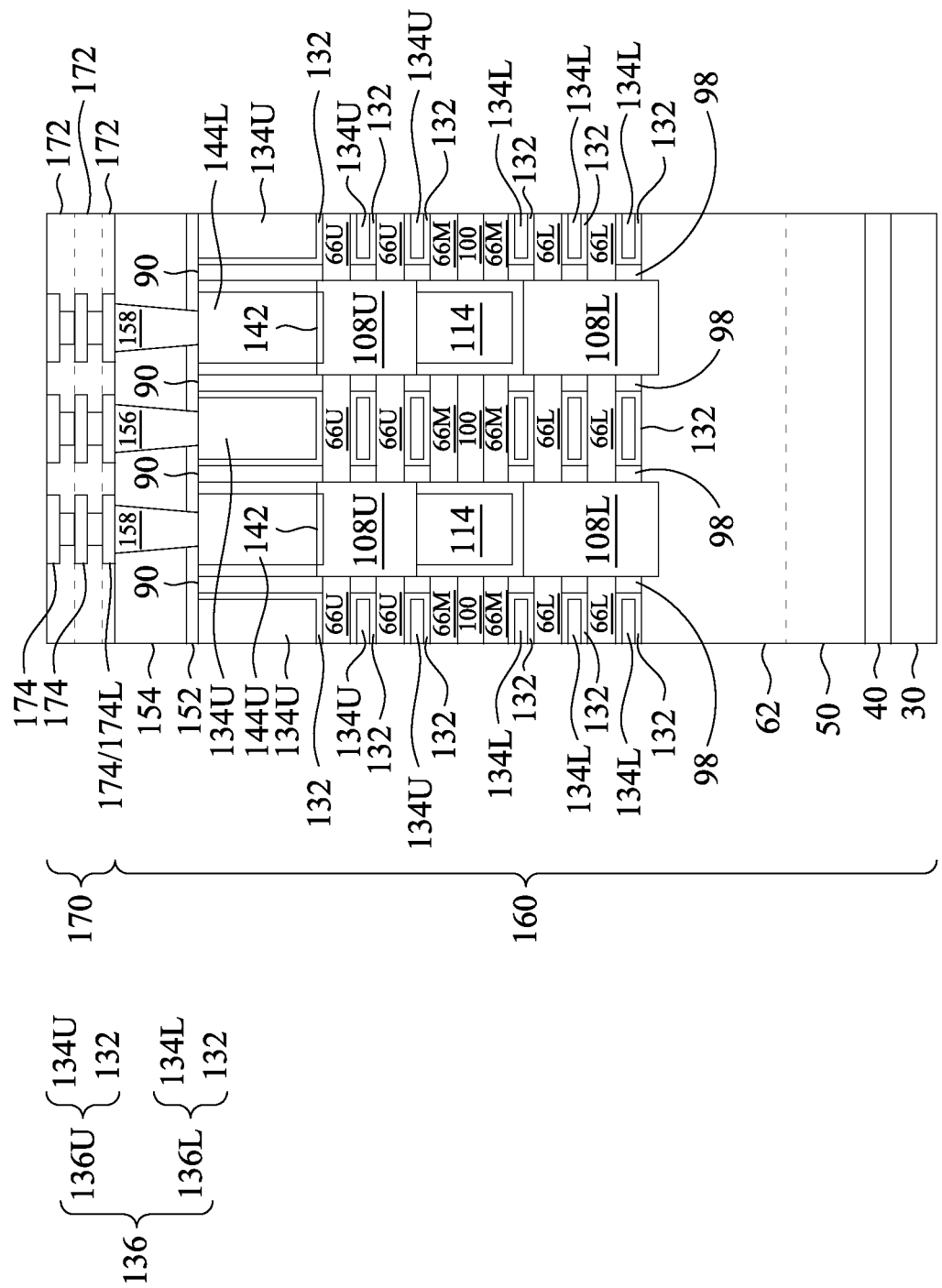

In FIG. 7, metal-semiconductor alloy regions 142 and source/drain contacts 144L/144U are formed through the second ILD 124 to electrically couple to the upper epitaxial source/drain regions 108U and/or the lower epitaxial source/drain regions 108L. As an example to form the source/drain contacts 144L/144U, openings are formed through the second ILD 124 and the second CESL 122 using acceptable photolithography and etching techniques. A liner (not separately illustrated), such as a diffusion barrier layer, an adhesion layer, or the like, and a conductive material are formed in the openings. The liner may include titanium, titanium nitride, tantalum, tantalum nitride, or the like. The conductive material may be cobalt, tungsten, copper, a copper alloy, silver, gold, aluminum, nickel, or the like. A removal process may be performed to remove excess material from the top surfaces of the gate spacers 90, the second ILD 124, and the gate stacks 136. The remaining liner and conductive material form the source/drain contacts 144L/144U in the openings. In some embodiments, a planarization process such as a CMP, an etch-back process, combinations thereof, or the like is utilized. After the planarization process, the top surfaces of the gate spacers 90, the second ILD 124, and the source/drain contacts 144L/144U are substantially coplanar (within process variations).

Optionally, metal-semiconductor alloy regions 142 are formed at the interfaces between the source/drain regions 108 and the source/drain contacts 144L/144U. The metal-semiconductor alloy regions 142 can be silicide regions formed of a metal silicide (e.g., titanium silicide, cobalt silicide, nickel silicide, etc.), germanide regions formed of a metal germanide (e.g. titanium germanide, cobalt germanide, nickel germanide, etc.), silicon-germanide regions formed of both a metal silicide and a metal germanide, or the like. The metal-semiconductor alloy regions 142 can be formed before the material(s) of the source/drain contacts 144L/144U by depositing a metal in the openings for the source/drain contacts 144L/144U and then performing a thermal anneal process. The metal can be any metal capable of reacting with the semiconductor materials (e.g., silicon, silicon-germanium, germanium, etc.) of the source/drain regions 108 to form a low-resistance metal-semiconductor alloy, such as nickel, cobalt, titanium, tantalum, platinum, tungsten, other noble metals, other refractory metals, rare earth metals or their alloys. The metal can be deposited by a deposition process such as ALD, CVD, PVD, or the like. After the thermal anneal process, a cleaning process, such as a wet clean, may be performed to remove any residual metal from the openings for the source/drain contacts 144, such as from surfaces of the metal-semiconductor alloy regions 142. The material(s) of the source/drain contacts 144L/144U can then be formed on the metal-semiconductor alloy regions 142.

An etch stop layer (ESL) 152 and a third ILD 154 are then formed. In some embodiments, The ESL 152 may include a dielectric material having a high etching selectivity from the etching of the third ILD 154, such as, aluminum oxide, aluminum nitride, silicon oxycarbide, or the like. The third ILD 154 may be formed using flowable CVD, ALD, or the like, and the material may include PSG, BSG, BPSG, USG, or the like, which may be deposited by any suitable method, such as CVD, PECVD, or the like.

Subsequently, gate contact plugs 156 and source/drain vias 158 are formed to contact the upper gate electrodes 136U and the source/drain contacts 144L/144U, respectively. As an example to form the gate contacts 156 and the source/drain vias 158, openings for the gate contacts 156 and the source/drain vias 158 are formed through the third ILD 154 and the ESL 152. The openings may be formed using acceptable photolithography and etching techniques. A liner (not separately illustrated), such as a diffusion barrier layer, an adhesion layer, or the like, and a conductive material are formed in the openings. The liner may include titanium, titanium nitride, tantalum, tantalum nitride, or the like. The conductive material may be cobalt, tungsten, copper, a copper alloy, silver, gold, aluminum, nickel, or the like. A planarization process, such as a CMP, may be performed to remove excess material from the top surface of the third ILD 154. The remaining liner and conductive material form the gate contacts 156 and the source/drain vias 158 in the openings. The gate contacts 156 and the source/drain vias 158 may be formed in distinct processes, or may be formed in the same process. Although shown as being formed in the same cross-section, it should be appreciated that each of the gate contacts 156 and the source/drain vias 158 may be formed in different cross-sections, which may avoid shorting of the contacts.

The active devices as illustrated are collectively referred to as a device layer 160. A front-side interconnect structure 170 is formed on the device layer 160. The front-side interconnect structure 170 includes dielectric layers 172 and layers of conductive features 174 in the dielectric layers 172. The dielectric layers 172 may include low-k dielectric layers formed of low-k dielectric materials. The dielectric layers 172 may further include passivation layers, which are formed of non-low-k and dense dielectric materials such as Undoped Silicate-Glass (USG), silicon oxide, silicon nitride, or the like, or combinations thereof over the low-k dielectric materials. The dielectric layers 172 may also include polymer layers.

As subsequently described in greater detail, the substrate 30 will later be removed and replaced with a second interconnect structure (e.g., a back-side interconnect structure). Thus, the device layer 160 of active devices is disposed between the front-side interconnect structure 170 and a back-side interconnect structure 200 (see FIG. 12). The front-side and back-side interconnect structures each include conductive features that are connected to the devices of the device layer 160. The conductive features (e.g., interconnects) of the front-side interconnect structure will be connected to front-sides of the upper epitaxial source/drain regions 108U and the upper gate electrodes 134U to form functional circuits, such as logic circuits, memory circuits, image sensor circuits, or the like. Some of the conductive features (e.g., interconnects) of the back-side interconnect structure will be connected to back-sides of the lower epitaxial source/drain regions 108L and the lower gate electrodes 134L to form functional circuits. Additionally, some of the conductive features (e.g., power rails) of the back-side interconnect structure will be connected to back-sides of the lower epitaxial source/drain regions 108L to provide a reference voltage, supply voltage, or the like to the functional circuits.

After the front-side interconnect structure 170 is formed, a support substrate (not separately illustrated) may be bonded to a top surface of the front-side interconnect structure 170. The support substrate may be a glass support substrate, a ceramic support substrate, a semiconductor substrate (e.g., a silicon substrate), a wafer (e.g., a silicon wafer), or the like, which may be bonded to the front-side interconnect structure 170 by dielectric-to-dielectric bonds or the like. The support substrate may provide structural support during subsequent processing steps and in the completed device. After the support substrate is bonded to the front-side interconnect structure 170, the entire workpiece of the intermediate structure (the structure of FIG. 7) is flipped so that the back-side of the device layer 160 may be processed. The back-side of the device layer 160 refers to the side opposite to the front-side of the device layer 160 on which the front-side interconnect structure 170 is formed.

Figure 8:
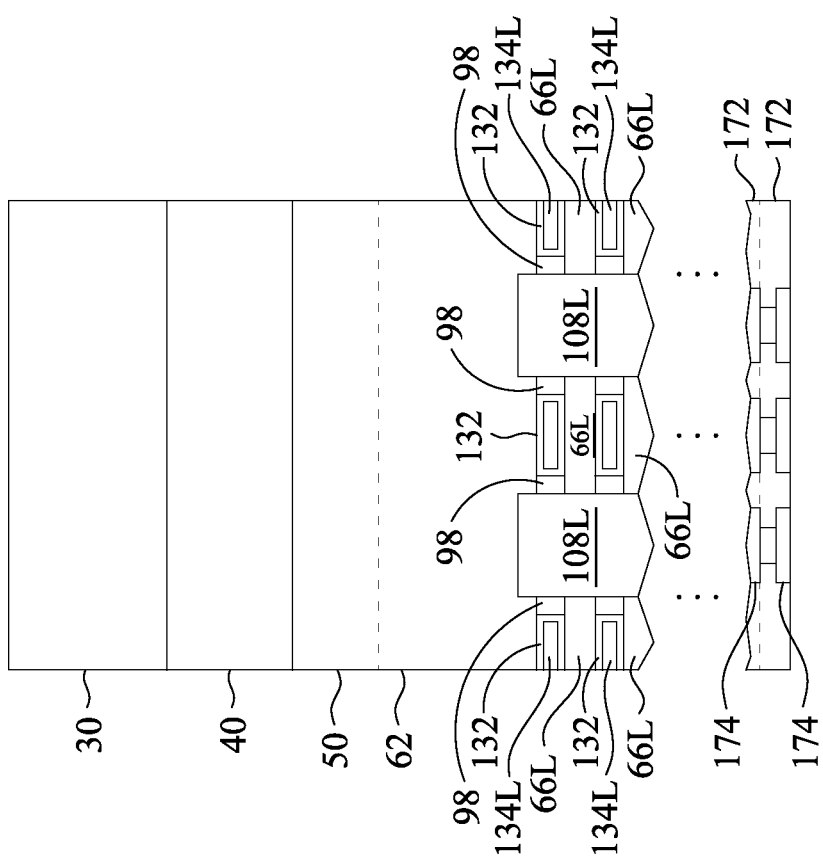

FIG. 8 illustrates a view of the substrate 30 over the ESL 40 which is over the substrate 50, after the structure is flipped over. The view of the structure in FIG. 8 is simplified for the sake of clarity. As illustrated in FIG. 8, the ESL 40 has a thickness between 100 nm and 1000 nm. As noted above, the ESL 40 as deposited may be made of silicon germanium where the germanium content is between 5% and 20%.

Figure 9B:
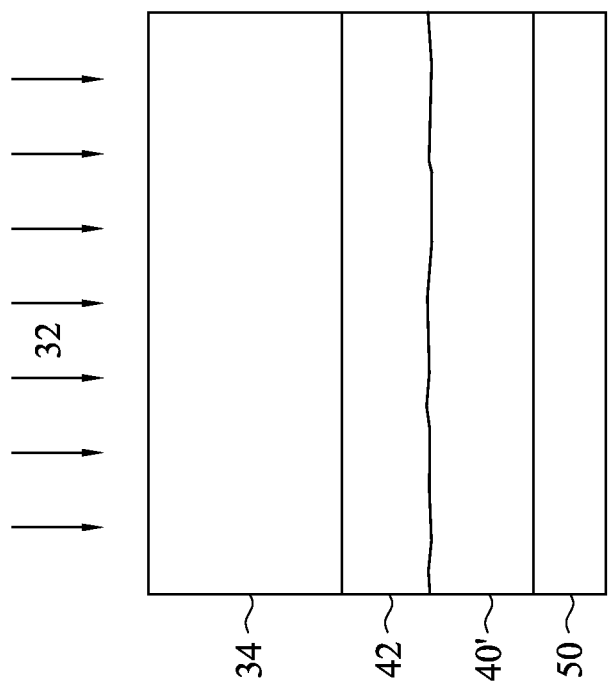
Figure 9A:
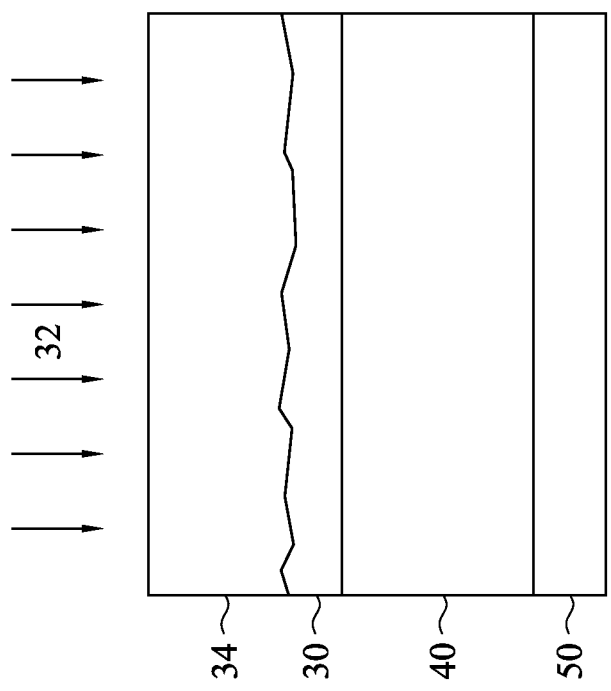

FIGS. 9A and 9B illustrate a simplified view of the substrate 30, ESL 40, and substrate 50 during an oxidation process 32. The oxidation process 32 introduces oxygen into the substrate 30 to oxidize the substrate 30 into the substrate 34. For example, if the substrate 30 is silicon, then the oxidized substrate 34 is silicon oxide. The oxidation process 32 may include any suitable oxidation process. In some embodiments, the oxidation process 32 may include a thermal oxidation, where water vapor or steam is introduced to the substrate 30, and the substrate heated. The $H_2O$ can fracture by the heat and the oxygen can combine with the material of the substrate 30. In some embodiments, the oxidation process 32 may include a plasma process, where oxygen gas is ignited into a plasma, thereby forming oxygen radicals and ions. These can strike the substrate 30, combining with the substrate 30 to oxidize the substrate 30 into the oxidized substrate 34.

FIG. 9A illustrates an intermediate stage of the oxidation process 32. In FIG. 9A, the substrate 30 is partially oxidized and transformed into the oxidized substrate 34. A portion of the substrate 30 remains unoxidized in this intermediate stage. FIG. 9B illustrates a further intermediate stage of the oxidation process 32. In FIG. 9B, the substrate 30 has been fully oxidized and transformed into the oxidized substrate 34. The ESL 40 is also partially oxidized and transformed into the oxidized ESL 42 and ESL 40'. As the ESL 40 oxidizes, the oxygen which permeates inwardly displaces at least some of the germanium of the ESL 40 so that it is placed deeper into the layer. The oxidized ESL 42, therefore has a lesser percentage concentration of germanium than the ESL 40. Conversely, the ESL 40' has a greater percentage concentration of germanium than the ESL 40 as it begins to collect the germanium from the upper oxidized portion that has been displaced into the lower portion.

Figure 10:
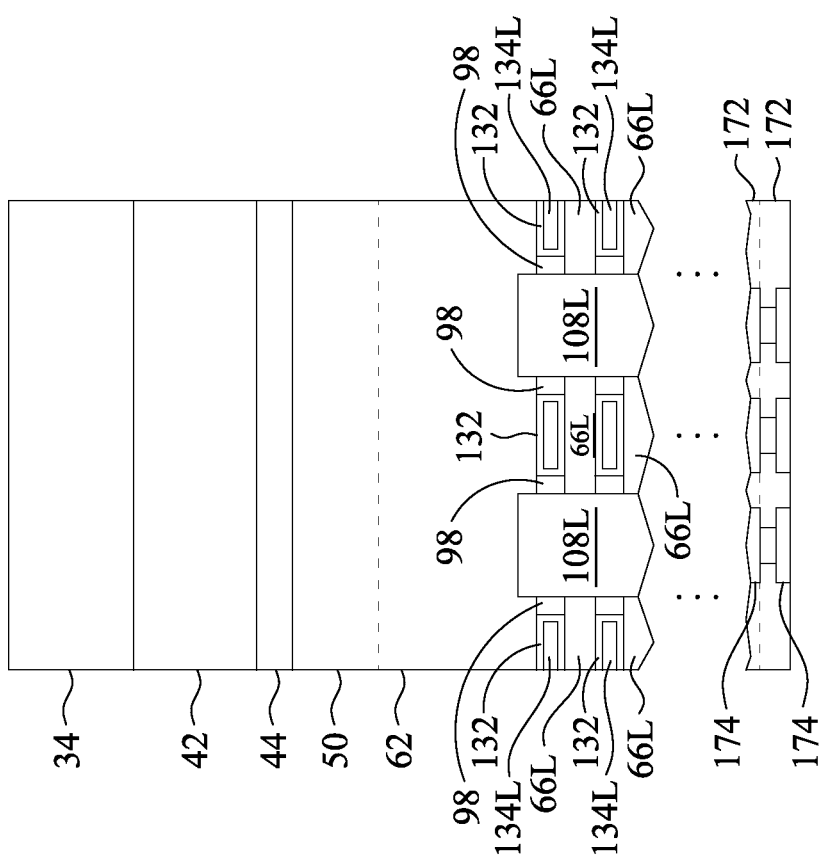

In FIG. 10, the oxidation process 32 is completed. Upon completion, the ESL 40 has been altered into a first portion (oxidized ESL 42) and a second portion (germanium enriched ESL 44). Although at least some of the germanium is displaced from the oxidized ESL 42, the oxidized ESL 42 may have some germanium remaining therein. In some embodiments between 80% and 100% of the germanium of the ESL 40 in the first portion has been driven into the second portion of the ESL 40 to form the germanium enriched ESL 44. In other words, about 0% to 20% of the germanium originally in the area of the ESL 40 defined by the first portion may remain in the oxidized ESL 42. The concentration of germanium in the oxidized ESL 42 may be between about 0% and 10%. The germanium enriched ESL 44 is enriched to have a concentration of germanium between about 20% and 50%.

Prior to the oxidation process 32, the thickness of the ESL 40 may be between about 100 nm and 1000 nm. Following the oxidation process 32, the germanium enriched ESL 44 may have a thickness between about 10 nm and 100 nm and the oxidized ESL 42 may have a thickness between about 100 nm and 1000 nm. Having a thicker ESL 40 provides more germanium for displacement into the germanium enriched ESL 44. A ratio of the thickness of the ESL 40 to the germanium enriched ESL 44 may be between about 2:1 to about 10:1.

Figure 11:
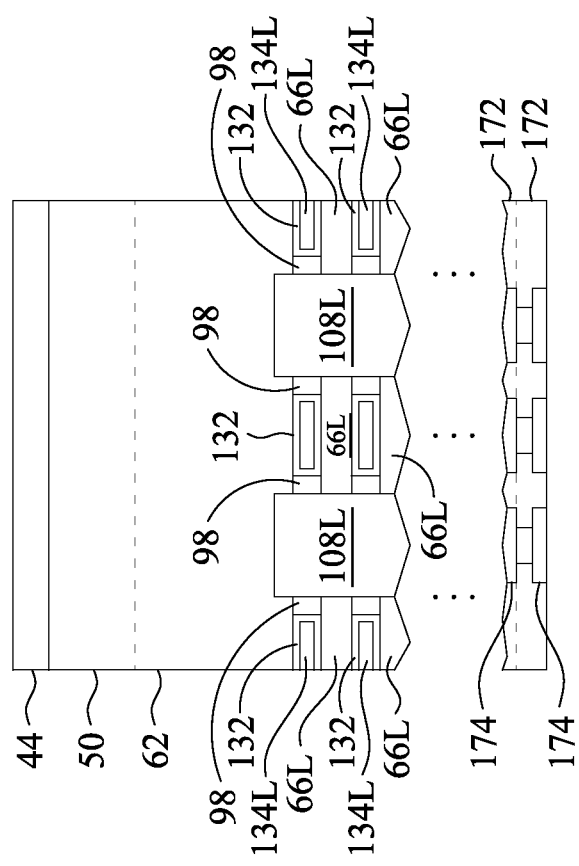

In FIG. 11, the oxidized substrate 34 is removed along with the oxidized ESL 42. Any suitable removal process may be used to remove the oxidized substrate 34 and oxidized ESL 42, such as by a CMP process, etching process, or combination thereof, using the germanium enriched ESL 44 as a stop layer. Thus, the removal process may be chemically based, using HF as an etchant. In some embodiments, a timed grinding process can be used initially, followed by a CMP process and/or etching process. Because the ESL 40 has been transformed to have a germanium enriched ESL 44, the germanium enriched ESL 44 can serve as a good stop layer for the removal process of the substrate 30. Accordingly, the oxidized substrate 34 and oxidized ESL 42 may be removed aggressively without damaging the underlying layers. Further, because the substrate 30 has been oxidized into the oxidized substrate 34, the oxidized substrate 34 can effectively be removed.

Figure 12:
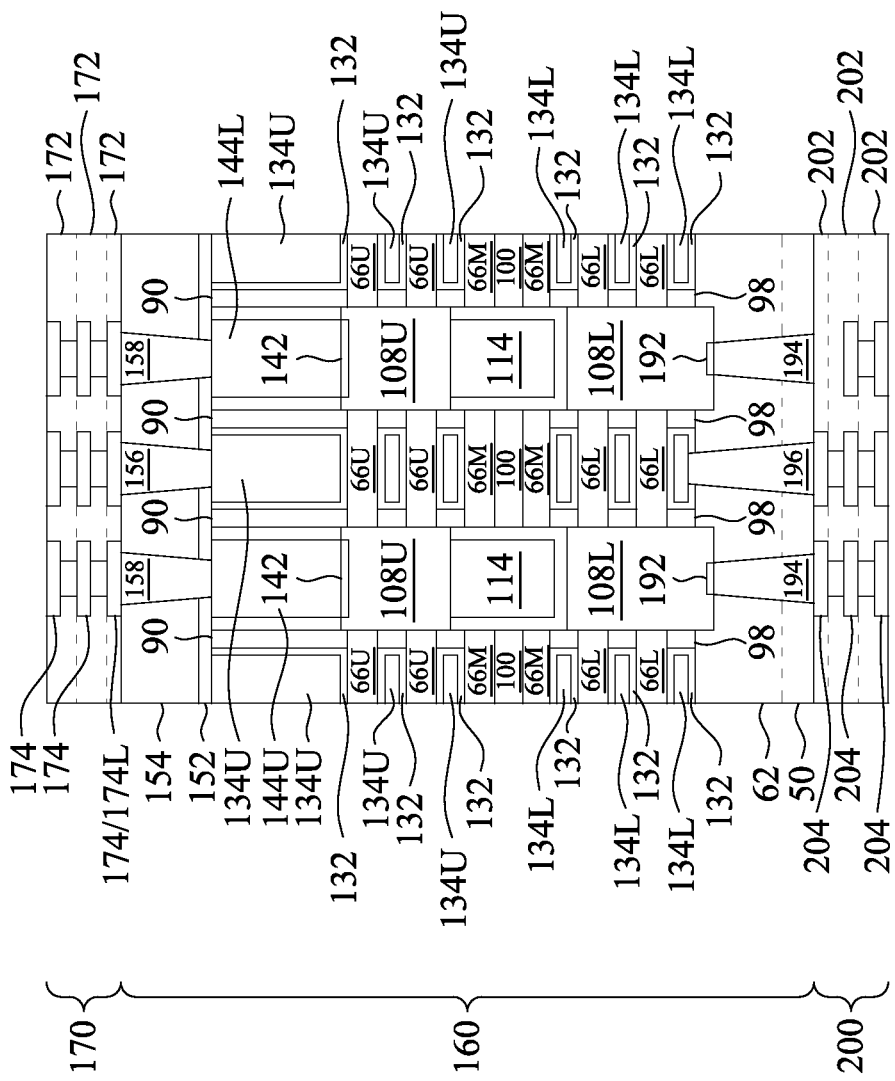

In FIG. 12, after the oxidized ESL 42 is removed, the germanium enriched ESL 44, may be removed by a suitable removal process, such as by a CMP process, etching process, or combination thereof. In some embodiments, the germanium enriched ESL 44 may be removed by using HF+HNO solution as an etchant. The germanium enriched ESL 44 may be selectively removed without damaging the underlying substrate 50.

In the illustrated embodiment, the removal process removes the germanium enriched ESL 44 while the substrate 50 and the fins 62 remain. However, in some embodiments, next the substrate 50 may be thinned or removed, and the fins 62 and isolation regions 70 may be thinned or removed, using a suitable etch back or CMP process.

FIG. 12 further illustrates lower source/drain contacts 194 and lower gate contacts 196 are formed through the fins 62. The lower source/drain contacts 194 may be physically and electrically coupled to the lower epitaxial source/drain regions 108L. Specifically, the lower source/drain contacts 194 are coupled to the back-sides of the lower epitaxial source/drain regions 108L. The lower gate contacts 196 may be physically and electrically coupled to the lower gate electrodes 134L. In some embodiments, the lower gate contacts 196 may be omitted from the lower epitaxial source/drain regions 108L which are electrically connected to the upper source/drain contacts 144L/144U. In other embodiments, the lower gate contacts 196 may be included for the lower epitaxial source/drain regions 108L that are also electrically connected to the upper source/drain contacts 144L/144U.

As an example to form the lower source/drain contacts 194, openings for the lower source/drain contacts 194 may be formed through the fins 62 (if present), and openings for the lower gate contacts 196 may be formed through the fins 62 (if present) and the gate dielectrics 132. The openings may be formed using acceptable photolithography and etching techniques. A liner (not separately illustrated), such as a diffusion barrier layer, an adhesion layer, or the like, and a conductive material are formed in the openings. The liner may include titanium, titanium nitride, tantalum, tantalum nitride, or the like. The conductive material may be cobalt, tungsten, copper, a copper alloy, silver, gold, aluminum, nickel, or the like. A planarization process, such as a CMP, may be performed to remove excess material. The remaining liner and conductive material form the lower source/drain contacts 194 and the lower gate contacts 196 in the openings. The lower source/drain contacts 194 and the lower gate contacts 196 may be formed in distinct processes, or may be formed in the same process. Although shown as being formed in the same cross-section, it should be appreciated that each of the lower source/drain contacts 194 and the lower gate contacts 196 may be formed in different cross-sections, which may avoid shorting of the contacts.

Optionally, metal-semiconductor alloy regions 192 are formed at the interfaces between the lower source/drain contacts 194 and the lower epitaxial source/drain regions 108L. The metal-semiconductor alloy regions 192 can be silicide regions formed of a metal silicide (e.g., titanium silicide, cobalt silicide, nickel silicide, etc.), germanide regions formed of a metal germanide (e.g. titanium germanide, cobalt germanide, nickel germanide, etc.), silicon-germanide regions formed of both a metal silicide and a metal germanide, or the like. The metal-semiconductor alloy regions 192 can be formed before the lower source/drain contacts 194 by depositing a metal in the openings for the lower source/drain contacts 194 and then performing a thermal anneal process. The metal can be any metal capable of reacting with the semiconductor materials (e.g., silicon, silicon-germanium, germanium, etc.) of the lower epitaxial source/drain regions 108L to form a low-resistance metal-semiconductor alloy, such as nickel, cobalt, titanium, tantalum, platinum, tungsten, other noble metals, other refractory metals, rare earth metals or their alloys. The metal can be deposited by a deposition process such as ALD, CVD, PVD, or the like. After the thermal anneal process, a cleaning process, such as a wet clean, may be performed to remove any residual metal from the openings for the lower source/drain contacts 194, such as from surfaces of the metal-semiconductor alloy regions 192. The material(s) of the lower source/drain contacts 194 can then be formed on the metal-semiconductor alloy regions 192.

A back-side interconnect structure 200 is then formed on the back-side of the substrate 50. The back-side interconnect structure 200 is referred to as a back-side interconnect structure because it is formed at the back-side of the device layer 160. The back-side interconnect structure 200 includes dielectric layers 202 and layers of conductive features 204 in the dielectric layers 202. The dielectric layers 202 may include low-k dielectric layers formed of low-k dielectric materials. The dielectric layers 202 may further include passivation layers, which are formed of non-low-k and dense dielectric materials such as Undoped Silicate-Glass (USG), silicon oxide, silicon nitride, or the like, or combinations thereof over the low-k dielectric materials. The dielectric layers 202 may also include polymer layers.

Embodiments may achieve advantages. By utilizing a thicker silicon germanium etch stop layer with a lower germanium concentration, fracturing can be avoided in the etch stop layer. This silicon germanium etch stop layer can be altered using an oxidation process to drive the germanium into a high germanium concentration portion of the etch stop layer, while mitigating the risk of layer fracturing which can propagate to other layers. The high germanium concentration serves as a good etch stop to remove a substrate from the back side of the workpiece. With the back side of the workpiece exposed, contact structures, including power rails and interconnects, and the like, may be formed at the back side of the workpiece.

In some embodiments, a method includes forming a lower semiconductor nanostructure and an upper semiconductor nanostructure, the upper semiconductor nanostructure disposed directly over the lower semiconductor nanostructure, the lower semiconductor nanostructure disposed over an etch stop layer (ESL), the ESL disposed over a semiconductor substrate, the ESL comprising silicon germanium, the ESL having a different material composition than the semiconductor substrate; forming a lower semiconductor structure at each end of the lower semiconductor nanostructure and an upper semiconductor nanostructure at each end of the upper semiconductor structure; forming a lower gate structure wrapping around the lower semiconductor nanostructure and an upper gate structure wrapping around the upper semiconductor nanostructure; oxidizing the semiconductor substrate; oxidizing the ESL, thereby forming a germanium enriched portion of the ESL; and removing the semiconductor substrate and an oxidized portion of the ESL, using the germanium enriched portion of the ESL as an etch stop. In some embodiments, the method further includes isolating the upper semiconductor structure from the lower semiconductor structure by a first isolation structure. In some embodiments, the method further includes isolating the upper semiconductor nanostructure from the lower semiconductor nanostructure by a second isolation structure. In some embodiments, the lower semiconductor structure is an opposite type from the upper semiconductor structure. In some embodiments, the method further includes forming an upper gate contact to the upper gate structure; and forming a lower gate contact to the lower gate structure, the upper gate contact and lower gate contact formed on opposing sides relative to the upper gate structure and lower gate structure. In some embodiments, the method further includes prior to oxidizing the semiconductor substrate, flipping the semiconductor substrate over to expose a bottom surface of the semiconductor substrate. In some embodiments, oxygen from oxidizing the ESL at the bottom surface drives germanium downward to concentrate at a lower surface of the ESL. In some embodiments, the method further includes the germanium enriched portion of the ESL has a germanium concentration between 20% and 50%. In some embodiments, a ratio of a thickness of the ESL prior to oxidation to a thickness of the germanium enriched portion of the ESL is between about 2:1 to 10:1. In some embodiments, a concentration of germanium in the oxidized portion of the ESL is a positive value between 0% and 10%.

In some embodiments, a method includes forming a silicon germanium layer over a silicon substrate; forming a silicon layer over the silicon germanium layer; forming an alternating series of semiconductor layers over the silicon layer; patterning first nanostructures and second nanostructures from the alternating series of semiconductor layers; patterning a dummy gate structure over the first nanostructures and the second nanostructures; removing the dummy gate structure, thereby exposing the first nanostructures and the second nanostructures; removing the second nanostructures; forming a replacement gate surrounding the first nanostructures; oxidizing the silicon substrate and a portion of the silicon germanium layer to form a germanium enriched portion of the silicon germanium layer and an oxidized portion of the silicon germanium layer; and using the germanium enriched portion of the silicon germanium layer as a stop layer to remove the silicon substrate and the oxidized portion of the silicon germanium layer. In some embodiments, an upper subset of the first nanostructures provide channel regions of a first nanostructure-FET, wherein a lower subset of the first nanostructures are provide channel regions of a second nanostructure-FET, the first nanostructure-FET having a different conductivity type than the second nanostructure-FET. In some embodiments, the upper subset of the first nanostructures is separated from the lower subset of the first nanostructures by an isolation structure. In some embodiments, the first nanostructure-FET is a n-type transistor, wherein the second nanostructure-FET is an p-type transistor. In some embodiments, the method further includes after removing the silicon substrate and the oxidized portion of the silicon germanium layer, forming a contact to electrically couple the replacement gate. In some embodiments, the germanium enriched portion of the silicon germanium layer has a germanium concentration at least two times greater than a germanium concentration of the silicon germanium layer prior to oxidizing the silicon substrate.

In some embodiments, a method includes flipping a workpiece over to expose a silicon substrate; oxidizing the silicon substrate to transform the silicon substrate into a silicon oxide substrate; oxidizing a first portion of a silicon germanium layer underlying the silicon oxide substrate to drive some germanium of the silicon germanium layer away from the silicon oxide substrate; concentrating the driven germanium at a second portion of the silicon germanium layer to form a sublayer of concentrated germanium; and removing the silicon oxide substrate and the first portion of the silicon germanium layer, while using the sublayer of concentrated germanium as a stop layer. In some embodiments, the workpiece includes a first nanostructure and a second nanostructure of two nano field effect transistors (nanoFETs), wherein the two nanoFETs are vertically stacked. In some embodiments, the method further includes removing the sublayer of concentrated germanium; and forming a contact to a back side of a first gate electrode. In some embodiments, the method further includes forming a contact to an upper side of a second gate electrode, the second gate electrode being over the first gate electrode.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
    forming a lower semiconductor nanostructure and an upper semiconductor nanostructure, the upper semiconductor nanostructure disposed directly over the lower semiconductor nanostructure, the lower semiconductor nanostructure disposed over an etch stop layer (ESL), the ESL disposed over a semiconductor substrate, the ESL comprising silicon germanium, the ESL having a different material composition than the semiconductor substrate;
    forming a lower semiconductor structure at each end of the lower semiconductor nanostructure and an upper semiconductor structure at each end of the upper semiconductor nanostructure;
    forming a lower gate structure wrapping around the lower semiconductor nanostructure and an upper gate structure wrapping around the upper semiconductor nanostructure;
    oxidizing the semiconductor substrate;
    oxidizing the ESL, thereby forming a germanium enriched portion of the ESL; and
    removing the semiconductor substrate and an oxidized portion of the ESL, using the germanium enriched portion of the ESL as an etch stop.

2. The method of claim 1, further comprising:
    isolating the upper semiconductor structure from the lower semiconductor structure by a first isolation structure.

3. The method of claim 1, further comprising:
    isolating the upper semiconductor nanostructure from the lower semiconductor nanostructure by a second isolation structure.

4. The method of claim 1, wherein the lower semiconductor structure is an opposite type from the upper semiconductor structure.

5. The method of claim 1, further comprising:
    forming an upper gate contact to the upper gate structure; and
    forming a lower gate contact to the lower gate structure, the upper gate contact and lower gate contact formed on opposing sides relative to the upper gate structure and lower gate structure.

6. The method of claim 1, further comprising:
    prior to oxidizing the semiconductor substrate, flipping the semiconductor substrate over to expose a bottom surface of the semiconductor substrate.

7. The method of claim 6, wherein oxygen from oxidizing the ESL at the bottom surface drives germanium downward to concentrate at a lower surface of the ESL.

8. The method of claim 1, wherein the germanium enriched portion of the ESL has a germanium concentration between 20% and 50%.

9. The method of claim 1, wherein a ratio of a thickness of the ESL prior to oxidation to a thickness of the germanium enriched portion of the ESL is between about 2:1 to 10:1.

10. The method of claim 1, wherein a concentration of germanium in the oxidized portion of the ESL is a positive value between 0% and 10%.

11. A method comprising:
forming a silicon germanium layer over a silicon substrate;
forming a silicon layer over the silicon germanium layer;
forming an alternating series of semiconductor layers over the silicon layer;
patterning first nanostructures and second nanostructures from the alternating series of semiconductor layers;
patterning a dummy gate structure over the first nanostructures and the second nanostructures;
removing the dummy gate structure, thereby exposing the first nanostructures and the second nanostructures;
removing the second nanostructures;
forming a replacement gate surrounding the first nanostructures;
oxidizing the silicon substrate and a portion of the silicon germanium layer to form a germanium enriched portion of the silicon germanium layer and an oxidized portion of the silicon germanium layer; and
using the germanium enriched portion of the silicon germanium layer as a stop layer to remove the silicon substrate and the oxidized portion of the silicon germanium layer.

12. The method of claim 11, wherein an upper subset of the first nanostructure provides channel regions of a first nanostructure-FET, wherein a lower subset of the first nanostructures provides channel regions of a second nanostructure-FET, the first nanostructure-FET having a different conductivity type than the second nanostructure-FET.

13. The method of claim 12, wherein the upper subset of the first nanostructures is separated from the lower subset of the first nanostructures by an isolation structure.

14. The method of claim 12, wherein the first nanostructure-FET is an n-type transistor, and wherein the second nanostructure-FET is a p-type transistor.

15. The method of claim 11, further comprising:
after removing the silicon substrate and the oxidized portion of the silicon germanium layer, forming a contact to electrically couple the replacement gate.

16. The method of claim 11, wherein the germanium enriched portion of the silicon germanium layer has a germanium concentration at least two times greater than a germanium concentration of the silicon germanium layer prior to oxidizing the silicon substrate.

17. A method comprising:
flipping a workpiece over to expose a silicon substrate;
oxidizing the silicon substrate to transform the silicon substrate into a silicon oxide substrate;
oxidizing a first portion of a silicon germanium layer underlying the silicon oxide substrate to drive some germanium of the silicon germanium layer away from the oxidation silicon oxide substrate;
concentrating the driven germanium at a second portion of the silicon germanium layer to form a sublayer of concentrated germanium; and
removing the silicon oxide substrate and the first portion of the silicon germanium layer, while using the sublayer of concentrated germanium as a stop layer.

18. The method of claim 17, wherein the workpiece includes a first nanostructure and a second nanostructure of two nano field effect transistors (nanoFETs), wherein the two nanoFETs are vertically stacked.

19. The method of claim 17, further comprising:
removing the sublayer of concentrated germanium; and
forming a contact to a back side of a first gate electrode.

20. The method of claim 19, further comprising:
forming a contact to an upper side of a second gate electrode, the second gate electrode being over the first gate electrode.

* * * * *